United States Patent Office 3,582,327

Patented June 1, 1971

3,582,327

PROCESS FOR TRANSFERRING PARTICLE IMAGES FROM PHOTOPOLYMERIZED IMAGE-BEARING LAYERS

Robert Henry Boyd and Victor Fu-Hua Chu, East Brunswick, N.J., assignors to E. I. du Pont de Nemours and Company, Wilmington, Del.

No Drawing. Filed Jan. 31, 1968, Ser. No. 701,857
Int. Cl. G03c 7/16, 11/12
U.S. Cl. 96—28 8 Claims

ABSTRACT OF THE DISCLOSURE

Method of forming an image on the surface of a receptor element from an element comprising (a) a support, (b) a photopolymerizable layer, and (c) a cover sheet by giving the layer an overall exposure to actinic radiation, before or after an imagewise exposure, sufficient to form an addition polymer but insufficient to completely polymerize the layer exposing the layer to actinic light to form an addition polymer image in said layer, removing the cover sheet, applying finely divided pigment particles to the non-exposed image areas, placing the layer in contact with a receptor surface, and applying heat and pressure and removing the receptor element while still hot. The resulting image is dry, has no appreciable relief, and has a matte, ink like appearance.

BACKGROUND OF THE INVENTION

Field of the invention

This invention relates to processes of image reproduction. More particularly it relates to a process of transferring an image embodying finely divided particles from a photohardenable image-bearing layer to a receptor surface by the use of heat and pressure.

Status of the prior art

Copying processes involving dusting pigments on a tacky photopolymer image following by transfer of the image to a receptor such as paper have been described in the patent literature, for example, in assignee's patents to Burg and Cohen, U.S. 3,060,023; 3,060,024; and 3,060,025, and in assignee's pending application by Celeste and Chu, U.S. Ser. No. 684,945, filed Nov. 22, 1967. Prior art processes, however, have some disadvantages. The images have significant relief so that it is difficult to obtain high-quality images when it is necessary to superimpose images to make multicolored images. Prior art images are frequently soft and require a time-consuming post-exposure step to harden them for resistance to abrasion. These images are shiny and do not resemble images printed with ink, which is a disadvantage in some applications.

SUMMARY OF THE INVENTION

The process comprises the steps in either order of (1) Giving a photopolymerizable element having (a) support, (b) a photopolymerizable layer containing (i) a thermoplastic organic compound solid at 50° C., (ii) at least one non-gaseous addition polymerizable monomer having a boiling point above 100° C. at normal atmospheric pressure, being capable of forming a high polymer by photoinitiated addition polymerization and having a plasticizing action on said thermoplastic compound, and (iii) an addition polymerization initiator activatable by actinic light and thermally inactive below 185° C. an overall exposure to actinic radiation to polymerize said monomer but insufficient to completely polymerize said layer; and (2) Exposing the layer imagewise to form an image of addition polymer in said layer, and then in order (3) Applying solid, finely divided particles to the non-exposed image areas and removing them from exposed image areas;

(4) Placing the layer in contact with a receptor sheet and heating the layer to 100° C. to 160° C. while in contact; and (5) Removing the sheet with the transferred particle image on its surface while within said temperature range.

In practicing the invention; (1) any cover sheet is stripped off at room temperature, (2) the photo-hardened layer is dusted at room temperature with a suitable finely divided colorant which adheres to the partially hardened areas but not to be completely hardened areas; (3) the element is laminated with heat and pressure to a suitable receptor surface; and (4) the element is stripped from the receptor while hot. By this process the colorant adhering to the partially hardened areas is transferred to the receptor surface while little or none of the photopolymer is transferred.

The image obtained on the receptor by this process is dry, so that no postexposure is required to harden it; has little or no relief, so that other images may be superimposed easily by the same process; and has a matte, inklike appearance.

DESCRIPTION OF THE PREFERRED EMBODIMENTS

The element used in the image transfer step comprises (a) a support, (b) a photopolymerizable layer containing some areas which are fully exposed or polymerized and other areas which are underexposed or partially polymerized, said areas being so disposed as to form a latent image, and (c) a transparent cover sheet which is relatively impermeable to oxygen. Such elements result from an overall exposure and an imagewise exposure of a photopolymerizable element to actinic radiation, the exposures being made in either order.

In practicing this invention the cover sheet is stripped from the element at room temperature, a finely divided colorant or other finely divided material is dusted at room temperature onto the image exposed layer and the excess colorant is removed as described in U.S. 3,060,024. The colorant adheres to the underexposed areas of the photopolymerizable layer but not to the fully exposed areas of said layer to make the latent image visible. The toned photopolymer matrix is then placed in contact with a receptor surface such as paper and laminated to said receptor surface with heat and pressure. The heat and pressure may be applied by means well known in the art such as heated rolls and platens. The preferred temperature is 100° C. to 150° C. The element is stripped from the receptor while hot. By this process the colorant is transferred from the element to the receptor surface while little or none of the photopolymer is transferred.

The photopolymerizable layers generally have a thickness of 0.0001 to 0.01 inch on a flexible support transparent to actinic radiation.

Suitable supports are disclosed in U.S. Pat. 3,060,023. A preferred support is 0.004" thick biaxially oriented polyethylene terephthalate. The support may be coated with a subbing composition such as that disclosed in Alles, U.S. 2,779,684, Example IV.

The photopolymerizable layer is comprised of a photopolymerizable monomer in combination with a compatible binder. The layer also contains a free radical-generating addition polymerization initiator. Suitable free radical initiated, chain propagating addition polymerizable ethylenically unsaturated compounds for use in the simple monomer or monomer-polymer binder photopolymerizable layers are described in Burg et al., U.S. Pat. 3,060,023;

Celeste et al., U.S. Pat. 3,261,686; and in assignee's Cohen and Schoenthaler, U.S. application Ser. No. 370,338, filed May 26, 1964 now U.S. Pat. No. 3,380,831. Polymers for use in the monomer-polymer binder system and preferred free radical generating addition polymerization initiators are described in U.S. 3,060,023.

The cover sheet should be transparent and relatively nonpermeable to oxygen. A preferred cover sheet is 0.001" thick polyethylene terephthalate.

Suitable colorants for use in this invention are finely divided solid materials such as pigments, powders, dyes and the like. Preferred colorants are cellulose acetate resist dispersed pigments.

In preparing the element for use in this invention, two exposures to actinic radiation are used. One exposure is uniform over the entire area of the element, the other is imagewise. Either exposure may be made first, but giving the overall exposure first has some advantages, for said overall exposure may be made some time in advance of the imagewise exposure. The overall exposure may be made either through the support or through the cover sheet, while the imagewise exposure is generally made through the cover sheet.

Suitable light sources for exposing the element are disclosed in assignee's pending application by Celeste and Chu, U.S. Ser. No. 684,945. The overall exposure is at least about two-thirds shorter than imagewise exposure and preferably is 1–8 seconds. The imagewise exposure is made through a process transparency as described in assignee's application, U.S. Ser. No. 684,945. The imagewise exposure is about 20 to 60 seconds or more.

A preferred receptor surface is glossy paper but other receptors such as those disclosed in U.S. 3,060,026 can be used.

The invention will be further illustrated by, but is not intended to be limited to, the following examples.

EXAMPLE I

| The following solution was prepared | G. |
|---|---|
| (1) Polyoxyethylated trimethylol propane triacrylate [1] | 70.0 |
| (2) Methyl methacrylate polymer | 100.0 |
| (3) Polyoxyethylene dodecyl ether | 15.0 |
| (4) 2-ethylanthraquinone | 3.0 |
| (5) 2,2'-dihydroxy-4-methoxybenzophenone | 2.5 |
| (6) Trichloroethylene | 1000.0 |

[1] Example I of assignee's French Pat. 1,33,298, May 23, 1966.

The solution was coated (coating weight 180 mg./dm.$^2$) on a 0.004" polyethylene terephthalate support which was coated with a thin vinylidene chloride copolymer sublayer as described in Example IV of Alles, U.S. Pat. 2,779,684. The coating was allowed to dry. A cover sheet of 0.001" thick polyethylene terephthalate was laminated to the clear photopolymerizable layer.

The element was exposed overall from the support side for seven seconds. The exposure was made on a Nu Arc "Flip-Top" Plate Maker, Model FT26M–2 carbon arc light source. A second, imagewise exposure was made with the same source from the cover sheet side through a process transparency for 20 seconds. The cover sheet was stripped off and the photopolymerizable layer was dusted at room temperature with Phthalo Green Extra Yellowish Cellulose Dispersion Powder, made by Harmon Colors, Division of Allied Chemical Corporation. The toned element was placed in contact with glossy paper, laminated between a hot roll and hot platen at 115° C. at a pressure of 1.5 lb. per linear inch and stripped while hot at a rate of 0.2" per second.

The image obtained on the paper was dry, had no appreciable relief, and had a matte, inklike appearance.

EXAMPLE II

The element of Example I was first given an imagewise exposure from the cover sheet side for 45 seconds and then an overall exposure of 7 seconds from the support side. The element was toned, laminated and stripped as in Example I except that Quindo Magenta Cellulose Acetate Dispersion Powder made by Harmon Colors was used and the lamination was done at 140° C. The image had the characteristics of the image in Example I.

EXAMPLE III

The element of Example I was given an overall exposure of 7 seconds with the Nu-Arc Plate Maker and then an imagewise exposure of 60 seconds; both exposures were made through the cover sheet. The cover sheet was stripped and the photopolymerizable layer was toned, laminated, and stripped as in Example II, except that the temperature was 120° C. The image showed the characteristics of the image of Example I except in those areas which received no light in the imagewise exposure, where total transfer of the matrix occurred.

ADVANTAGES OF THE INVENTION

This invention overcomes some of the disadvantages previously associated with thermal transfer of photopolymerizable elements. The images obtained on the receptor surfaces by the process of this invention are dry and require no postexposure to harden them for resistance to mechanical abrasion. These images have little or no relief. Thus, they are useful in multicolor work which requires the superposition of several images. These images have a matte, inklike appearance, which is desirable in many applications.

The embodiments of the invention in which an exclusive property or privilege is claimed are defined as follows:

1. The process comprises the steps in either order of (1) giving a photopolymerizable element having (a) a support, (b) a photopolymerizable layer containing (i) a thermoplastic organic compound solid at 50° C., (ii) at least one non-gaseous addition polymerizable monomer having a boiling point above 100° C. at normal atmospheric pressure, being capable of forming a high polymer by photo-initiated addition polymerization and having a plasticizing action on said thermoplastic compound, and (iii) an addition polymerization initiator activatable by actinic radiation and thermally inactive below 185° C. an overall exposure to actinic radiation to polymerize said monomer but insufficient to completely polymerize said layer; and (2) exposing the layer imagewise to actinic radiation to form an image of addition polymer in said layer, and then in order;

(3) applying solid, finely divided particles, said particles, said particles being solid at 160° C. and below and capable of adhering to the unexposed photopolymerizable layer, to the non-exposed image areas and removing the particles from exposed image areas;

(4) placing the layer in contact with a receptor sheet and heating the layer to a transfer temperature of 110° C. to 160° C. while in contact with the sheet; and (5) removing the receptor sheet with the transferred particle image on its surface while within said temperature range.

2. A process according to claim 1, wherein the ethylenically unsaturated compound is a crosslinkable acrylic acid ester.

3. A process according to claim 1, wherein the ethylenically unsaturated compound is a crosslinkable acrylic acid ester and said initiator is a polynuclear quinone.

4. A process according to claim 1, wherein the ethylenically unsaturated compound is a cross-linked acrylic acid ester and said initiator is 2-ethyl-anthraquinone.

5. A process according to claim 1, wherein said unsaturated compound is a polyoxyethylated trimethylolpropane triacrylate.

6. A process according to claim 1, wherein the photopolymerizable layer has a thickness from 0.0001 to 0.01 inch.

7. A process according to claim 1, wherein the photopolymerizable layer has a thickness from 0.0001 to 0.001 inch.

8. The product obtained by step (1) of the process of claim 1.

References Cited

UNITED STATES PATENTS

| | | | |
|---|---|---|---|
| 3,060,024 | 10/1962 | Burg et al. | 96—115 |
| 3,202,508 | 8/1965 | Heroit | 96—28 |
| 3,380,831 | 4/1968 | Cohen et al. | 96—115 |

NORMAN G. TORCHIN, Primary Examiner

R. E. FICHTER, Assistant Examiner

U.S. Cl. X.R.

96—11